United States Patent [19]

Ackermann et al.

[11] Patent Number: 5,030,475
[45] Date of Patent: Jul. 9, 1991

[54] PLASMA-ENHANCED CVD COATING PROCESS

[75] Inventors: Ulrich Ackermann, Mainz-Gonsenheim; Ralf T. Kersten, Bremthal; Heinz-Werner Etzkorn, Neu-Ansbach; Volker Paquet; Uwe Rutze, both of Mainz, all of Fed. Rep. of Germany

[73] Assignee: Schott Glaswerke, Mainz, Fed. Rep. of Germany

[21] Appl. No.: 403,430

[22] Filed: Sep. 6, 1989

[30] Foreign Application Priority Data

Sep. 6, 1988 [DE] Fed. Rep. of Germany ....... 3830215
Aug. 7, 1989 [DE] Fed. Rep. of Germany ....... 3926023

[51] Int. Cl.$^5$ ..................... C23C 16/48; C23C 16/50
[52] U.S. Cl. ..................... 427/39; 427/38; 427/45.1; 427/54.1; 118/723
[58] Field of Search ............. 427/38, 39, 45.1, 54.1; 118/723

[56] References Cited

U.S. PATENT DOCUMENTS

| | | | |
|---|---|---|---|
| 4,282,267 | 8/1981 | Küyel | 427/38 |
| 4,401,054 | 8/1983 | Matsuo et al. | 118/723 |
| 4,434,188 | 2/1984 | Kamo et al. | 427/39 |
| 4,526,805 | 7/1985 | Yoshizawa | 427/39 |
| 4,726,963 | 2/1988 | Ishihara et al. | 427/39 |
| 4,879,140 | 11/1989 | Gray et al. | 427/38 |
| 4,910,043 | 3/1990 | Freeman et al. | 427/39 |

FOREIGN PATENT DOCUMENTS

| | | |
|---|---|---|
| 0074212 | 3/1983 | European Pat. Off. . |
| 57-167631 | 10/1982 | Japan . |
| 62-298106 | 12/1987 | Japan .................. 118/723 |
| 2185129A | 7/1987 | United Kingdom . |

OTHER PUBLICATIONS

Tsu et al., *J. Vac. Sci & Tech. A*, vol. 4, No. 3, May/Jun. 1986, pp. 480–485.
Brodsky et al., *IBM Tech Disc. Bull*, vol. 22, No. 8A, Jan. 1980, pp. 3391–3392.

*Primary Examiner*—Shrive Beck
*Assistant Examiner*—Margaret Burke
*Attorney, Agent, or Firm*—Millen, White & Zelano

[57] ABSTRACT

A plasma or photo-induced chemical vapor deposition coating process and apparatus are provided for applying thin dielectric coatings on planar, curved, and large area substrates. A plasma is generated in a tubular outer conductor. This plasma or the UV radiation occurring in the plasma passes through an opening into a reaction chamber. The opening preferably extends axially along the outer conductor and communicates with the interior of the reaction chamber. At least one component of the reaction gas is introduced directly to the opening or into the reaction chamber adjacent to the opening, bypassing the outer conductor. In this apparatus, the reactive deposition of a coating onto a substrate occurs only in the reaction chamber and below the opening from the outer conductor.

22 Claims, 4 Drawing Sheets

PLASMA-ENHANCED CVD COATING PROCESS

BACKGROUND OF THE INVENTION

The present invention relates in general to a coating process and apparatus therefor and, more particularly, to a chemical vapor deposition (CVD) process and apparatus for coating various shapes of substrates.

PRIOR ART

It is known to apply a thin coating on lenses for the purpose of producing, for example, reflecting, polarizing, or anti-reflection lenses. These thin coatings can be applied by vapor deposition, sputtering, etc. These coatings, however, have the disadvantage that some of the important properties, e.g., refractive index, absorption, or compactness, differ from the properties of the coating material before it is applied. Consequently, it is extremely difficult to produce such coatings with specific properties.

Photo-CVD and plasma-CVD coating processes used for producing wave guides do not have these disadvantages because the coatings obtained by reactive deposition from a plasma or excitation by UV radiation are of a structure similar to molten glass of the same composition. In these processes, a mixture of reaction gases are reacted, resulting in a coating material which is deposited on a substrate. These processes have been optimized heretofore only for round shapes. Thin coatings of less than 100 nm can be produced in only a few of these known processes. EP 36,191 describes a plasma-CVD coating process in which very thin coatings can be produced on only the inside of a tube.

EP 17,226 discloses a plasma-CVD coating process for coating planar surfaces. In this process, the substrates are placed in a quartz tube through which the reaction gases are passed. The size of the substrate is limited by the size of the quartz glass tube used, as well as by the desired surface of the substrate to be coated. Coating can take place virtually anywhere in the tube; consequently, a large excess of reaction gas must be used. Depending on the size and shape of the substrate, it is not always possible to obtain a sufficiently large flow of reaction gases across the surface to be coated. As a result, the coating is applied unevenly and is often non-homogenous.

DE-OS 37 26 775 discloses a plasma-CVD process for coating planar surfaces in which a reaction gas flows through a perforated plate below and parallel to which is positioned the surface to be coated. The plasma which initiates the coating reaction is generated between the perforated plate and the surface to be coated. This process has the advantage that it more effectively utilizes the reaction gases and permits the coating of relatively large surfaces. However, this process has the disadvantage that the gases undergoing reaction cannot be uniformly removed, which results in an uneven and non-uniform coating. Since the reaction gases are exited to form a plasma between the perforated plate and substrate, the danger exists that the plasma will extend into contact with or through the perforated plate and produce a coating thereon, which can clog the perforations in the plate.

Similar apparatus is described in EP 74,212 and U.S. Pat. No. 4,434,742. In the apparatus described in these patents, the reaction gas flows through a perforated plate, the surface to be coated being positioned either parallel or perpendicular to the perforated plate. Unlike the previously described process, the plasma in the reaction gas is generated below and/or above the perforated plate in a prechamber. In these apparatus, the consumed reaction gases cannot always be uniformly removed. Also, the reaction prechamber and the perforated plate through which the plasma (exited reaction gases) passes are heavily coated, resulting in a large waste of coating material and the necessity to frequently remove coating material from the reaction prechamber passages and the perforated plate.

It is, therefore, desired to have a CVD process for applying thin coatings to substrates and to coat very large substrates. It is also desired to have such a process which can be used to apply an even (uniform) coating on planar and curved substrates. It is desired to have such a process which also avoids the deposition of a coating onto the reaction gas supply lines and conductors for the microwave radiation.

SUMMARY OF THE INVENTION

An object of the invention, therefore, is to provide an improved chemical vapor deposition process or the like for coating a variety of geometric surfaces. Another object is to provide apparatus to conduct the process of the invention.

Upon further study of the specification and appended claims, further objects and advantages of this invention will become apparent to those skilled in the art.

To attain the process object of the invention, there is provided a chemical vapor deposition process for producing a coating in a reaction chamber in which reaction gas flowing adjacent a surface of a substrate deposits a coating thereon, the reaction gas being excited by energy transferred thereto from a gas discharge or plasma being produced in a prechamber so as to initiate deposition of the coating in said reaction chamber, the improvement comprising introducing at least part of the reaction gas into the reaction chamber from a source other than the prechamber, thereby bypassing the prechamber.

It is preferred that the energy in the prechamber is in the form of a plasma brought about by high frequency radiation, and that the prechamber has an opening into the reaction chamber. It is also preferred that the substrate is coated in the region of the opening.

DETAILED DESCRIPTION

Excitation of the reaction gas is generally caused by the energy in a prechamber which generally communicates by way of an opening with the reaction chamber. In a preferred aspect of the present invention, at least part or one component of the reaction gas flows through a prechamber and through said opening into a reaction zone in the reaction chamber. By combining all of the parts or components of the mixture of reaction gases in a reaction zone inside the reaction chamber immediately above the substrate, the possibility of the deposition of coating material in the prechamber and reaction mixture supply lines is avoided. This can be accomplished in a number of preferred embodiments of the invention. For example, when the reaction gas is a mixture of silicon tetrachloride and oxygen, the oxygen component can flow through a prechamber and out an opening into a reaction zone inside the reaction chamber. The silicon tetrachloride component of the mixture of reaction gases can be introduced into the reaction chamber at the opening, thus bypassing the prechamber. Since the oxygen component is, in itself, incapable of deposition of a coating, no coating takes place in the prechamber. In a preferred embodiment, the oxygen is excited to produce a plasma in the prechamber. This plasma is discharged from the prechamber through an opening into the reaction zone, where it mixes with the silicon tetrachloride component at the opening. Only then is reactive deposition from the mixture of reaction gases possible.

The process of the present invention is particularly suitable for plasma-CVD coating processes, plasma impulse CVD coating processes (PICVD) being preferred since the consumed reaction gases can easily be removed between impulses so that each new plasma impulse acts on a mixture of fresh, unreacted reaction gases. Apart from the plasma-CVD coating processes, it is also preferred in an embodiment of the present invention to excite the reaction gas by UV radiation generated in a plasma. The photo-CVD coating process can also be combined with a plasma-CVD coating process in which the deposition takes place from the reaction gases in a plasma. The UV radiation promotes the formation of a plasma of reaction gases, so that a smaller field intensity of the electromagnetic radiation, preferably microwave radiation, is sufficient to excite the plasma.

According to a preferred aspect of the present invention, a part or component of the reaction gas is introduced from a plurality of lines into the reaction chamber in a direction somewhat parallel to the surface to be coated. It is preferred that the reaction gas is in laminar flow along the surface to be coated so as to achieve a more even coating. The supply lines for this one component are preferably arranged between the reaction chamber and prechamber in the direction of the reaction zone. The reaction gas emerging from the gas supply lines flows through a reaction zone substantially parallel to the surface to be coated.

In one preferred embodiment, the entire mixture of reaction gases is introduced from supply lines directly into the reaction zone, thus completely bypassing the prechamber. In another preferred embodiment, a part of the reaction gas from which no reactive deposition can take place is passed through a prechamber to a passage communicating with the reaction chamber. In this embodiment, the component of the reaction gas is excited to form a plasma which can be passed within the prechamber. The excited plasma flowing from the prechamber into the reaction chamber acts as a conductor for the exciting high frequency radiation.

In a preferred embodiment, the prechamber is formed of a metal tube, preferably of platinum, which also preferably has a slot-shaped opening. The slot in the prechamber is preferably in juxtaposition with and registers with a similar slot formed in the reaction chamber so as to form a passage between these chambers. The reaction of the mixture of reaction gases generally takes place in a reaction zone below the slot and inside of the reaction chamber.

It is preferred that when the reactive deposition takes place from a plasma, the size of the openings or of the slot has a dimension at least equal to $\lambda/40$ of the high frequency radiation or microwave frequency used in forming the plasma. $\lambda$ in this case is the wavelength of the high frequency radiation or microwave frequency of the respective energy source. In this preferred embodiment, the field intensity in the region of the opening or slot is sufficiently high to excite the reaction gas to initiate the deposition of coating material.

When reaction gas is excited by only UV radiation, the opening between the prechamber and reaction chamber can be smaller than $\lambda/40$. In such instances, it is preferred that the opening is between 1 mm and 10 mm.

An auxiliary gas can also be passed through the prechamber. The auxiliary gas can be excited to yield a plasma, and this excitation is conducted through the auxiliary gas and into the reaction zone. The auxiliary gas can, in turn, promote the excitation of the mixture of reaction gases to initiate a reaction which results in deposition of a coating material.

The auxiliary gas or component of the reaction gas can be passed through the prechamber a number of ways. For example, a tubular shield of electrically non-conductive material, e.g., quartz, can be positioned preferably concentrically within a tubular prechamber. This shield can also be provided with a slot-shaped opening above and registering with the preferred slot-shaped opening in the prechamber. The gas passing through this shield is preferably supplied thereto from both ends of the shield so that the gas or plasma emerging from the slot-shaped opening in the prechamber is as uniform as possible in composition. A plasma is preferably generated at both ends of the shield. In such cases, a pair of metal rings circumscribing the ends of the shield generate a plasma which is propagated through the gases inside the shield. Over the length of the shield, the plasma acts as a conductor for the electromagnetic radiation, the source of which is connected to the prechamber, which is always made from a conductive material, and to the metal rings.

In a preferred embodiment, a dielectric material lines the inside of a metal prechamber. In such cases, the gas flowing through the prechamber also flows in the annular space between the shield and the lining. In such cases, the slot-shaped opening in the shield can be omitted.

In another preferred embodiment, a dielectric closure is provided in the prechamber to channel the gas passing through the prechamber to the slot-shaped opening therein. The dielectric closure also aids in preventing the flow of reaction gases or consumed reaction gases into the prechamber.

In another preferred embodiment, the substrate is displaced relative to the opening when reaction gases are used to deposit a coating onto a substrate over a large area. In another preferred embodiment, the prechamber having reaction gas supply lines is displaced relative to the substrate. These displacements can be matched to conform to the contour of the surface to be coated. By displacing the substrate, for example, a number of times to and fro, a plurality of coating layers can be applied. This procedure can also be used to produce thicker coatings. The size of the surface on which deposition of coating takes place can be altered by displacing the substrate in a direction perpendicular to the opening between the prechamber and reaction chamber. This also alters the thickness of the coating deposited. Movement of the substrate can be used to vary the coating thickness and also create an even coating.

In order to coat relatively large surfaces, a plurality of prechambers can be connected to one reaction chamber, with the prechambers being capable of being operated alternatively or together.

The process of the present invention makes it possible to apply CVD coatings to large surfaces of about 0.1 to $2 \times 10$ square meters; $2 \times 10$ means a substrate surface having the dimensions of up to 2 m $\times$ 10 m (width $\times$ length) with the coatings not being restricted to planar surfaces. Also, a plurality of smaller targets can be coated. Preferably, the targets are arranged one behind the other and side by side (two-dimensionally) on a conveyor belt. Such smaller pieces have surfaces to be coated of about 2 to 1000 cm$^2$, and preferably 5 to 100 cm$^2$.

Using apparatus and the process of the present invention, dielectric and metal coatings can be applied which are used, for example, on lenses or beam wave guides. Reflecting, anti-reflection-coated, or polarizing lenses can, for example, be produced using the apparatus and process of the present invention. Wave guides, as described, for example, in U.S. Pat. Nos. 4,765,819 and 4,756,734, can be produced. After coating, the substrates can advantageously be treated in a manner conventionally used on molten glass.

The process of the present invention can, in principle, be used with all photo- and plasma-CVD coating processes. The PICVD process and continuous wave discharge processes are most preferred when used in conjunction with the process of the present invention.

BRIEF DESCRIPTION OF THE DRAWINGS

Various other features and attendant advantages of the present invention will be more fully appreciated as the same becomes better understood when considered in conjunction with the accompanying drawings, in which like reference characters designate the same or similar parts throughout the several views and wherein.

DETAILED DESCRIPTION OF THE DRAWINGS

Figure 1:
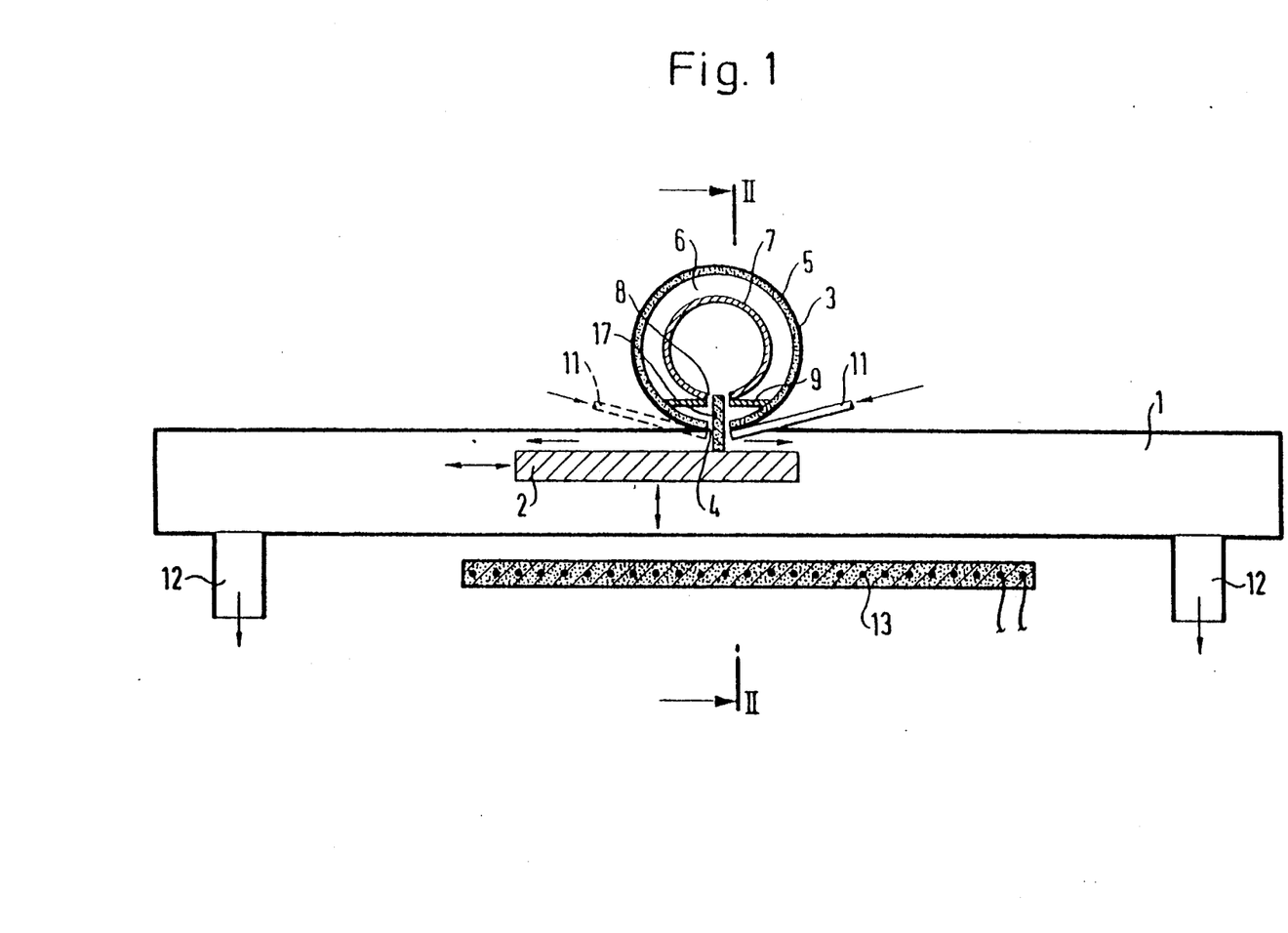
FIG. 1 is a schematic representation, in vertical section, taken along line I—I in FIG. 2, illustrating an apparatus according to the invention for coating planar substrates.
Figure 2:
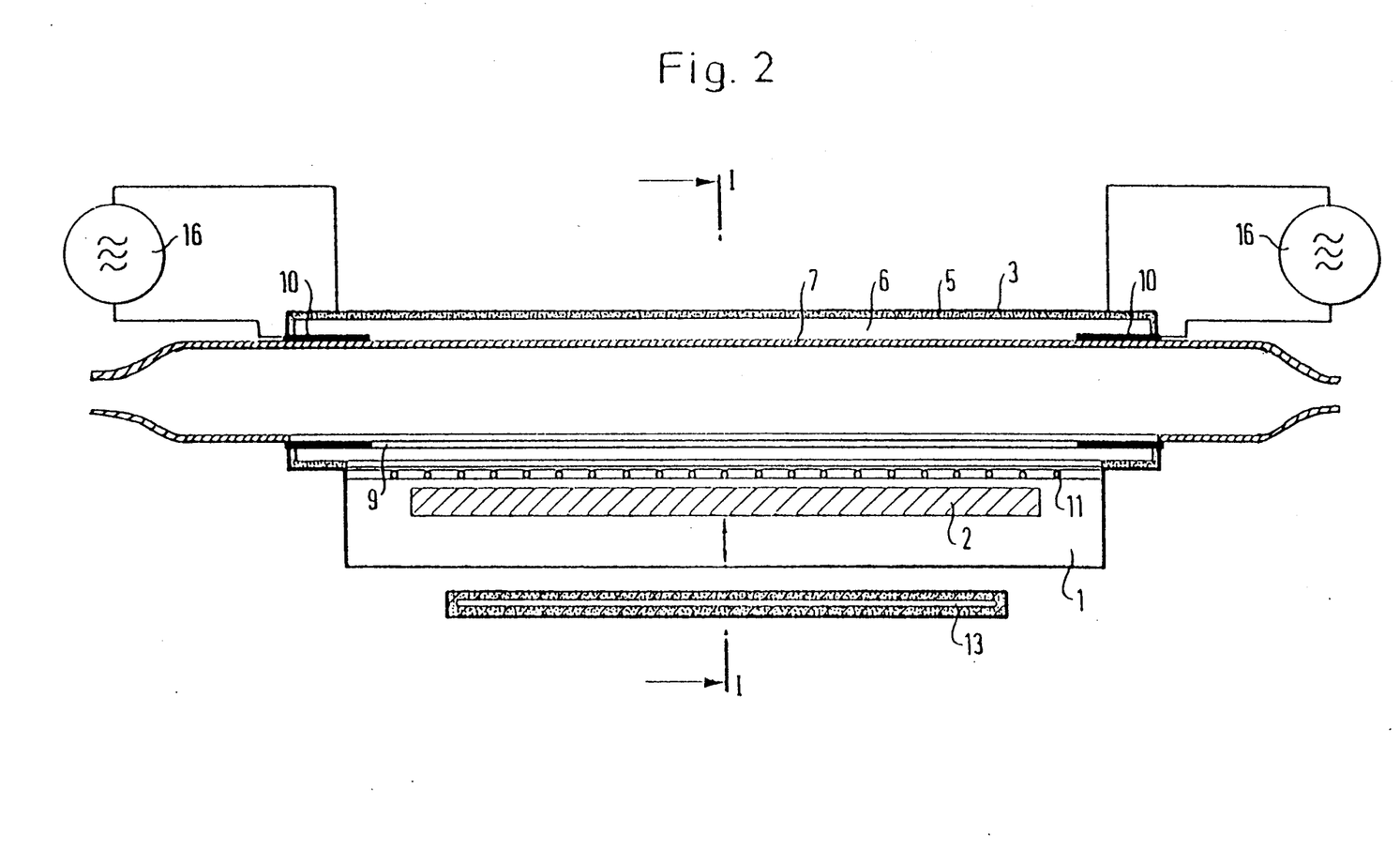
FIG. 2 shows in vertical section, taken along line II—II of FIG. 1, an illustration of the apparatus of FIG. 1.

The apparatus illustrated in FIGS. 1 and 2 contains a reaction chamber 1 in which substrate 2 is positioned for coating. Substrate 2 can be displaced both horizontally and vertically (see double-headed arrows). A tubular outer conductor 3 is in communication with reaction chamber 1 via a slot-shaped opening 4 extending axially along outer conductor 3. Outer conductor 3 includes electrically conductive material, e.g., platinum, platinum-alloy, or alloy from the platinum-group (rhodium, palladium, iridium, platinum) if a high temperature plasma is used, respectively, if the conductor 3 is exposed in operation to a temperature from 400° C. to 1100° C. or more; also, copper, stainless steel, or brass if in operation the temperature of the conductor 3 does not rise over 500° C., which forms an external shield for a microwave arrangement. Outer conductor 3 can include an inner lining 5 of a chemically resistant dielectric material which does not absorb microwaves or absorbs them only to a small extent. Preferred materials from which lining 5 can be formed are quartz glass and/or ceramics, e.g., Al$_2$O$_3$ ceramics, Al$_2$O$_3$/MgO ceramics if the lining 5 reaches in operation a temperature above 400° C.; otherwise, a lining 5 made of glass, such as borosilicate glass, is suitable.

Outer conductor 3 forms a prechamber 6, the inner space of which can be partitioned by shield 7. Preferably, the shield 7 comprises chemically resistant dielectric material which does not absorb microwaves or absorbs them only to a small extent. The shield 7 and the closure 9 can be formed of the same materials as the lining 5, preferably glass or quartz glass. If UV should penetrate through either the shield 7 or the closure 9, a material transparent to UV, such as quartz or quartz glass, can be used. The shield 7 is preferably circular, concentric with the outer conductor 3, and contains a slot-shaped opening 8 positioned radially with respect to the opening 4. Dielectric closure 9, formed of a material which does not absorb microwaves or absorbs them only to a small extent, as described above, extends along the underside of shield 7 substantially parallel to the opening 4. Closure 9 can hermetically seal off part of the prechamber 6 from the reaction chamber 1.

At both ends of shield 7 are annular inner conductors 10 to which microwave energy in the form of microwave pulses from one or more microwave resonators 16 can be coupled. See FIG. 2. The conductors 10 receive microwave energy in the form of microwave pulses from resonator 16. By means of a gas passing through shield 7, a plasma is thus formed which acts like an intrinsic inner conductor to the outer conductor 3 for the coupled electromagnetic radiation.

Transverse reaction gas supply lines 11, offset opposite one another, are arranged on both sides of the passage between the reaction chamber and outer conductor 3 such that incoming reaction gases in the region of opening 4 are preferably in laminar flow across the surface of substrate 2. The reaction gas flow (see arrows) is along the surface of substrate 2 where a coating is deposited. The spent or consumed reaction gases are then removed by a vacuum means (vacuum pump) via suction nozzles 12.

The plasma generated inside shield 7 comes into contact through opening 8 with the reaction gas supplied via reaction gas supply lines 11 or flowing in the direction of the opening 8. A reaction plasma 17 is thus formed in the region of opening 8 and the surface of substrate 2. This plasma extends from inner conductor 10 along slot-shaped opening 4, above and below said opening, as far as substrate 2. In accordance with the present invention, with the apparatus described herein, the reactive deposition from the plasma is confined to a small region of the reaction plasma 17, and thus deposition takes place substantially only on substrate 2.

The substrate 2 can be heated to the reaction temperature by resistance heater 13. The resistance heater 13 can be controlled so that the reaction temperature can be adapted to differing reaction conditions, for example, when different reaction gases are used.

Figure 3:
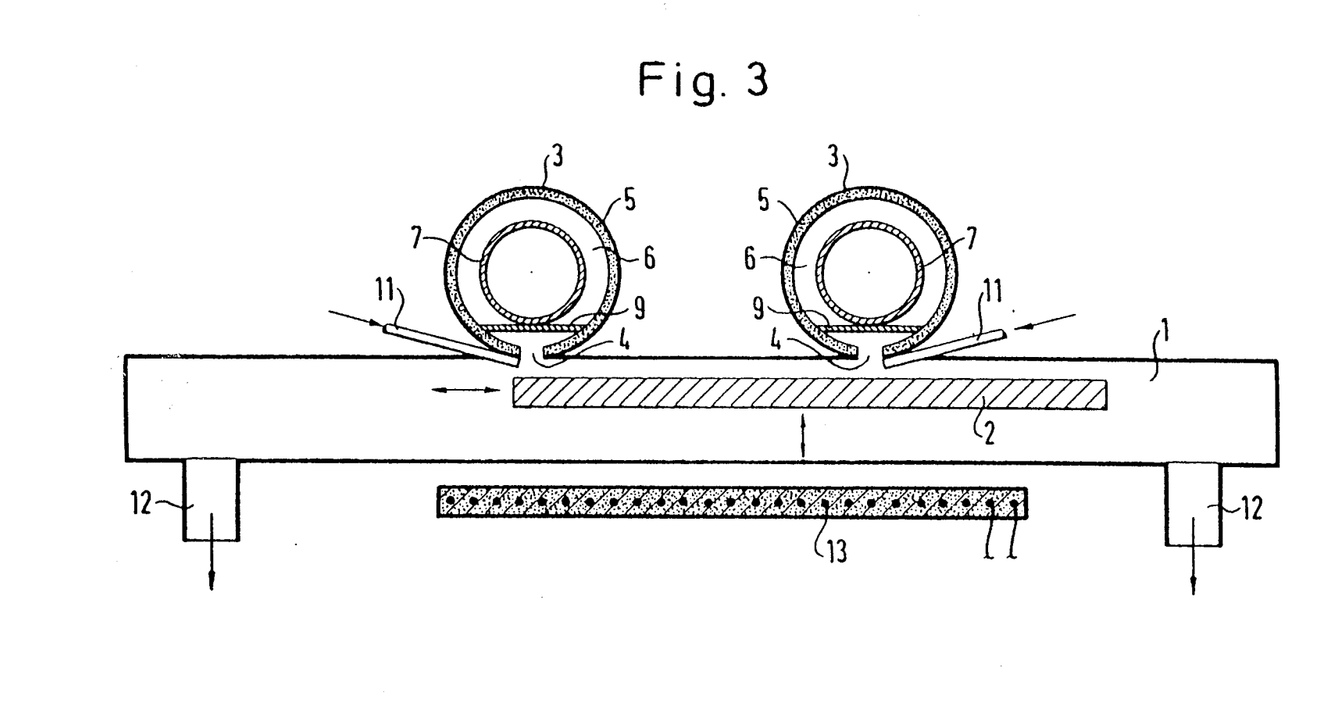
FIG. 3 is a schematic representation of another embodiment in which two reaction prechambers are used in the apparatus of FIG. 1.

FIG. 3 illustrates another embodiment, in which two microwave sources are arranged in parallel. The principle of operation in this embodiment is the same as in FIGS. 1 and 2, except that reaction gas supply lines 11 are only on one side of outer conductor 3, and shield 7 is closed fluidwise to the reaction chamber 1 by dielectric 9. In this case, a plasma is generated inside shield 7, and the UV radiation therefrom excites the reaction gases or generates a reaction plasma in the region of high field intensity in opening 4. In this case, dielectric 9 must, of course, be transparent to UV radiation.

Figure 4:
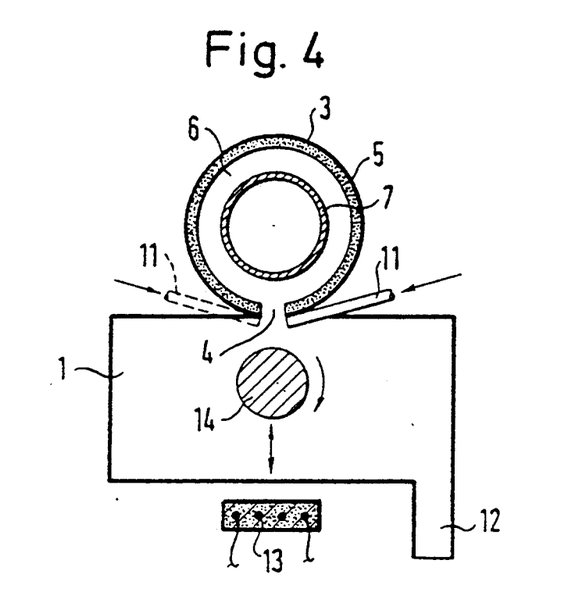
FIG. 4 shows another embodiment of FIG. 1 which can be used for externally coating rods or tubes.

FIG. 4 illustrates another embodiment used for coating a rod-shaped substrate 14. The design of the microwave arrangement corresponds to that shown in FIGS. 1 and 2, with the exception that shield 7 is closed to the reaction chamber 1, and the reaction prechamber 6 has no closure 9. In this embodiment, the prechamber 6 is closed off from the outside air, and a reaction gas, such as oxygen, or an auxiliary gas can be introduced into prechamber 6. The auxiliary gas, for example, argon, does not impede the chemical vapor deposition reaction but can form a plasma starting from inner conductors 10, which triggers the reaction of the mixture reaction gases.

Figure 5:
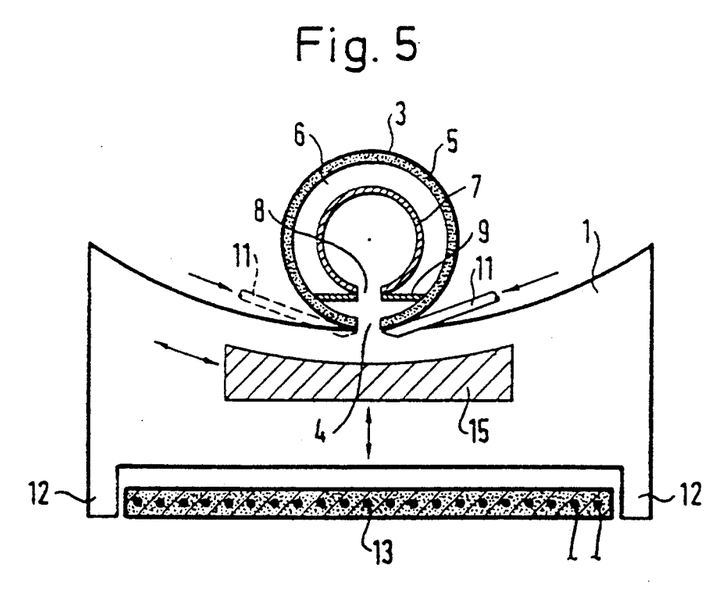
FIG. 5 shows another embodiment of FIG. 1 which can be used for internally coating curved substrates.

FIG. 5 illustrates another embodiment used for the internal coating of a substrate 15 having a curved inner face. The microwave arrangement used in FIG. 5 corresponds to that in FIGS. 1 and 2. The embodiment shown in FIGS. 1 and 5 can be used in CVD coating processes. The shape and dimensions of the apparatus in FIGS. 1-5 and the output of the microwave resonators 16 can be adapted by those skilled in the art to other plasma coating processes or photo-CVD coating processes. The apparatus in FIGS. 1-5 are not restricted to coating the substrates shown. By appropriately altering reaction chamber 1, other-shaped objects can be coated, for example, cubes, tubes—on the inside as well as on the outside, blanks for spectacles, irregularly curved surfaces, etc.

In a preferred embodiment, the prechamber carrying the reaction gases and source of excitation can be displaced or moved instead of the substrate to be coated. If the prechamber 6 is provided with closures, as in FIGS. 1-3 and 5, it can be filled with atmospheric air or other gases. If a dielectric lining 5 is provided inside outer conductor 3, the prechamber can also contain an auxiliary gas which, when excited, produces a plasma. The auxiliary gas, for example, argon, can be sealed in prechamber 6. In a preferred embodiment, the auxiliary gas flows axially through reaction prechamber 6.

In another preferred embodiment, the dielectric closure 9 is used to prevent contact of the auxiliary gas with the reaction gas and any undesired reactions between these gases. Closure 9 can be omitted when the auxiliary gas participates in the reaction or is a necessary component of the reaction gas. In the case of a reaction prechamber 6 having a dielectric closure 9, the pressure of the auxiliary gas can be adjusted to the optimum independently of the pressure of the reaction gas. If no plasma is generated between outer conductor 3 and shield 7, lining 5 can also be omitted, since lining 5 is used to prevent a short circuit between the plasma outside shield 7 and outer conductor 3. The interior of shield 7 can also be filled with an auxiliary gas or a component of the reaction gas which alone is incapable of deposition of a coating.

The auxiliary gases or components of the reaction gas flowing through prechamber 6 or shield 7 readily form a plasma, for example, excited by microwave radiation. This plasma transmits its excitation to the reaction gas in the region of opening 8. When oxygen is used, for example, this transmission of energy is promoted by high energy UV radiation, with transmission preferably taking place directly through an opening to the reaction gas. In the embodiment shown in FIGS. 1, 2, and 5, transmission takes place through slot-shaped opening 8.

The preferred embodiment shown in FIG. 3 can also be used for a continuous wave discharge process. In such a case, the microwave arrangement operates alternatively with the direction of displacement of the substrate 2. The reaction gas is introduced through reaction gas supply lines 11, which point in the direction of substrate displacement, and a plasma is generated until the direction of displacement changes. The consumed gases are then removed by vacuum means in the direction of displacement of the substrate.

When the entire mixture of reaction gases is supplied through reaction gas supply lines 11, the individual components of the reaction gas are preferably introduced through different reaction gas supply lines 11, the result being that the components of the reaction gas are mixed with one another only in the region of the substrate after discharge from the reaction gas supply lines. Separating the components of the reaction gas in this fashion prevents a reactive deposition in the immediate region of the reaction gas supply lines 11. The use of a large number of opposing offset reaction gas supply lines 11 ensures that intimate mixing of the components of the reaction gas occurs during the flow to the opening 4 and thus to the reaction plasma 17.

According to the present invention, a homogeneous coating is applied to a substrate along slot-shaped opening 4. The use of the special transverse reaction gas supply lines 11 prevents deposition on the inner wall of outer conductor 3 and facilitates deposition primarily on substrate 2. The continuous flow of reaction gas across the surface of the substrate is facilitated by the continuous withdrawal of consumed reaction gases by vacuum means such as a vacuum pump. In a PICVD process, the rate of gas flow and the interval between microwave pulses are preferably adjusted so that before ignition of a new plasma, the substrate in the region of slot-shaped opening 4 is coated by fresh reaction gas, and the freshly coated surface of the substrate is further displaced. The duration of the microwave pulse is adjusted to effect substantially complete reaction between the components of the reaction gas mixture. By adjustment of the reaction conditions, such as pressure, reaction gas composition, and pulse sequence, thin coatings, e.g., monomolecular coatings, can be deposited.

In order to increase the homogeneity of the coating, it is preferred that microwave energy be supplied from two sides, as shown in FIG. 2, and that the substrate be moved perpendicular to the gap (double-headed arrow). In this case, the direction and speed of movement are adjusted with the coating conditions to obtain a uniform and homogenous coating. The supply of reaction gases from opposing offset lines 11 (FIGS. 1, 4, and 5) has also been found to increase the homogeneity of the coating.

Depending on the reaction gases used, it is preferred to heat the substrate to the specific reaction temperature in order to prevent the formation of undesired reaction products. For example, when silicon tetrachloride and oxygen are used, the reaction temperature is approximately 1100° C. or is more than 300° C. when silicon hydride is used with nitrogen dioxide and ammonia as a reaction gas. Depending on the reaction conditions and the composition of the substrate, the coating process can be carried out at temperatures of, for example, 70° C. to 1600° C. The substrate can be heated, other than with a resistance heater 13, shown in FIGS. 1-3. For example, the substrate can be heated by optical, thermal, or electrical energy. The coating process can be used on solid bodies, such as glass, glass ceramic, ceramic, or dimensionally stable plastics having no plasticizer, or only a small portion thereof, e.g., CR-39 (CR-39 is a polymer suitable for eyeglasses, the polymer being polydiethyleneglycol diallylcarbonate.

In a preferred embodiment, a plurality of microwave arrangements can be operated in parallel, as illustrated in FIG. 3, in order to increase the deposition rate. Spacing between the microwave elements, the size of the substrate and the speed of the substrate, can be adjusted to optimize the coating process.

As illustrated in FIGS. 1-5, substrates which are planar or have other shapes, can also be coated. The movement of the substrate can here be adjusted to compensate for the shape of the substrate, for example, as a rotary or swinging movement.

Apart from PICVD or continuous wave processes described with a plasma extending over a substantial distance, the process of the present invention can also be used in other plasma coating processes with, for example, a plasma having a small area. In such cases, the substrate is preferably displaced in a plane below the plasma so as to obtain a homogenous coating layer.

Without further elaboration, it is believed that one skilled in the art can, using the preceding description, utilize the present invention to its fullest extent. The following preferred specific embodiments are, therefore, to be construed as merely illustrative and not limitative of the remainder of the disclosure in any way whatsoever.

In the foregoing and in the following example, all temperatures are set forth uncorrected in degrees Celsius; and, unless otherwise indicated, all parts and percentages are by weight.

The entire texts of all applications, patents and publications, cited above and below, and of corresponding West German Application No. P 38 30 215.2, filed Sept. 6, 1988, are hereby incorporated by reference.

EXAMPLE

A quartz glass pane 400 mm×400 mm×5 mm is coated using apparatus substantially corresponding to that shown in FIGS. 1 and 2. The quartz glass reaction chamber 1 has internal dimensions of 800 mm×600 mm×10 mm (length×width×height). A gap extends over the entire width, central with respect to the length, and above the gap is secured a tubular outer conductor 3 of platinum, open at both ends. The outer conductor 3 is 700 mm long and has an internal diameter of 40 mm. The slot-shaped opening 4 of outer conductor 3 is 600 mm×5 mm. Reaction gas supply lines 11 of quartz glass are arranged between outer conductor and reaction chamber 1.

A quartz glass shield 7, 1250 mm×20 mm×2 mm (length×external diameter×wall thickness), is arranged concentrically in outer conductor 3. Shield 7, which is closed at the bottom on both sides, as shown in FIGS. 3 and 4, is filled with argon. The pressure in shield 7 can be between 1 mbar and 0.1 bar. The space between shield 7 and outer conductor 3 is open to the atmosphere.

The ends of the shield 7 project outwardly from outer conductor 3 to the same extent. Dielectric closure 9 separates the majority of the prechamber 6 from the reaction chamber 1. The inner conductors 10, formed of platinum, are 100 mm×25 mm (length×internal diameter). The inner conductors 10 project from the ends of outer conductor 3 in a concentric arrangement into the interior of the prechamber 6.

The reaction gas comprises silicon tetrachloride and oxygen in a molar ratio of 1:4. Up to 14 mole percent of silicon tetrachloride can be replaced by germanium tetrachloride. Oxygen is supplied through the reaction gas supply lines 11, separated from the tetrachloride. The overall mass flow of reaction gas is 600 ml/minute at 1 bar and 20° C. Intimate mixing of the reaction gas takes place only outside the reaction gas supply lines 11. The oxygen can also be supplied through shield 7, as shown in FIG. 1.

The coating process is carried out using a microwave resonator having a frequency of 2.45 GHz, an average microwave output of 1.5 KW, an impulse sequence frequency of 100 Hz with an impulse length of 1.5 ms and an impulse break of 8.5 ms.

The gas pressure is 3 mbar, and the quartz glass pane 2 is heated to 1100° C. The rate of displacement of the quartz glass pane 2 parallel to the slot opening 4 is 50 mm/s.

A coating rate of approximately 225 nm/minute on one side of the quartz glass pane was obtained.

The preceding example can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. A chemical vapor deposition process for producing a coating on a surface of a substrate, in which a coating material is formed in a reaction chamber from a reaction gas flowing onto a surface to be coated of the substrate, comprising:
    exciting the reaction gas by a gas discharge which is generated by high-frequency radiation in a tubular prechamber to initiate reactive deposition on the surface to be coated of the substrate, the high-frequency radiation being coupled at least at one end of the tubular prechamber into the latter, the prechamber being connected by at least one energy-transmittable opening to the reaction chamber;
    passing at least part of the reaction gas to the opening from a source other than the prechamber, thereby bypassing the prechamber, passing excitation energy laterally from the tubular prechamber to the reaction gas via at least one of said openings in the prechamber;
    coating the substrate at substantially only the region of the opening, said substrate being in close proximity to the opening; and
    either moving the substrate relative to the opening or moving the prechamber relative to the substrate.

2. A process according to claim 1, wherein the reaction gas is excited to form a plasma, and the substrate is coated from this plasma.

3. A process according to claim 1, wherein the reaction gas is excited by UV radiation emanating from the gas discharge generated in the prechamber.

4. A process according to claim 1, wherein the reaction gas is excited to form a plasma and is initiated by UV radiation occurring in the prechamber.

5. A process according to claim 1, wherein an elongated slot is used as the opening.

6. A process according to claim 2, wherein an elongated slot is used as the opening.

7. A process according to claim 3, wherein an elongated slot is used as the opening.

8. A process according to claim 4, wherein an elongated slot is used as the opening.

9. A process according to claim 1, comprising a plurality of openings arranged in a row.

10. A process according to claim 1, wherein the opening has a diameter or a length of at least $\lambda/40$ of high-frequency radiation.

11. A process according to claim 1, wherein the reaction gas is passed between the reaction chamber and the prechamber to the reaction zone.

12. A process according to claim 1, wherein at least part of the prechamber is separated from the reaction chamber by a dielectric closure.

13. A process according to claim 1, wherein part of the reaction gas is passed to the opening around a shielding located inside the prechamber.

14. A process according to claim 1, wherein part of the reaction gas is passed through a shielding arranged in the prechamber above the opening, such that said part of the reaction gas substantially reaches the reaction chamber.

15. A process according to claim 1, wherein an auxiliary gas is excited in the prechamber.

16. A process according to claim 1, wherein the reactive deposition is distributed evenly on the surface to be coated of the substrate by a displacement of the substrate parallel to the opening.

17. A process according to claim 1, wherein a peripheral outer surface of the substrate is coated by rotating the substrate below the opening.

18. A process according to claim 16, wherein the surface of the substrate is coated a number of times by a reciprocating movement.

19. A process according to claim 17, wherein the surface of the substrate is coated a number of times by a reciprocating movement.

20. A process according to claim 1, wherein the substrate is moved perpendicular to the opening, thereby altering the size of the surface.

21. A process according to claim 1, wherein gas discharges are generated in a plurality of prechambers connected by openings to the reaction chamber.

22. A process according to claim 21, wherein the surface of the substrate has a dimension of 0.1 to 2 meters in width and about 1.0 meter in length.

* * * * *